US011131506B2

(12) United States Patent
Coteus et al.

(10) Patent No.: US 11,131,506 B2
(45) Date of Patent: Sep. 28, 2021

(54) BURST RESISTANT THIN WALL HEAT SINK

(71) Applicant: International Business Machines Corporation, Armonk, NY (US)

(72) Inventors: Paul W. Coteus, Yorktown, NY (US); Shawn A. Hall, Pleasantville, NY (US); Mark D. Schultz, Ossining, NY (US); Todd E. Takken, Brewster, NY (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 16/257,584

(22) Filed: Jan. 25, 2019

(65) Prior Publication Data

US 2019/0154340 A1  May 23, 2019

Related U.S. Application Data

(62) Division of application No. 14/818,064, filed on Aug. 4, 2015, now Pat. No. 10,222,125.
(Continued)

(51) Int. Cl.
*F28F 3/06* (2006.01)
*F28D 1/03* (2006.01)
(Continued)

(52) U.S. Cl.
CPC .......... *F28D 1/0308* (2013.01); *B23K 1/0016* (2013.01); *F28F 3/02* (2013.01);
(Continued)

(58) Field of Classification Search
CPC ... F28D 1/0308; B23K 1/0016; B23K 1/0012; H01L 23/473; H01L 21/4878;
(Continued)

(56) References Cited

U.S. PATENT DOCUMENTS 5,150,274 A   9/1992   Okada et al.
5,453,911 A   9/1995   Wolemuth et al.
(Continued)

FOREIGN PATENT DOCUMENTS

WO    WO2014112600 A1    7/2014

OTHER PUBLICATIONS

Schultz, "Laterally Compliant Hear Sink for Multi-Chip Modules", IBM Corporation, Thomas J. Watson Research Center, Jan. 10, 2010.
(Continued)

*Primary Examiner* — Jun S Yoo
(74) *Attorney, Agent, or Firm* — Scully, Scott, Murphy & Presser, P.C.; Daniel P. Morris

(57) ABSTRACT

An method for forming a cooling apparatus for cooling an electronic component. The apparatus has a planar top member of a thermal energy conductive material and a parallel planar bottom member of the material, the planar bottom member including a surface having regions configured for heat exchange contact with the electronic component. The planar top member has a plurality of stamped indent formations at a plurality of locations, each indent formation providing a contact surface such that the planar top member is affixed to the bottom member by braze or solder at each contact surface. Alternatively, the planar bottom member also has a plurality of stamped indent formations in alignment with indent formations of the top member. The planar top member is affixed to the bottom member by brazing or soldering each respective contact surface of an indent formation of the planar top member to an opposing contact surface of a corresponding indent formation of the parallel planar bottom member.

7 Claims, 7 Drawing Sheets

Related U.S. Application Data

(60) Provisional application No. 62/143,587, filed on Apr. 6, 2015.

(51) Int. Cl.

| | | |
|---|---|---|
| *F28F 3/02* | (2006.01) | |
| *H01L 23/473* | (2006.01) | |
| *H01L 21/48* | (2006.01) | |
| *B23K 1/00* | (2006.01) | |
| *B23P 15/26* | (2006.01) | |
| *F28F 3/14* | (2006.01) | |
| *B21D 53/02* | (2006.01) | |
| *F28F 3/04* | (2006.01) | |
| *B21D 53/04* | (2006.01) | |
| *F24S 10/50* | (2018.01) | |

(52) U.S. Cl.
CPC ...... *H01L 21/4878* (2013.01); *H01L 21/4882* (2013.01); *H01L 23/473* (2013.01); *B21D 53/022* (2013.01); *B21D 53/04* (2013.01); *B23K 1/0012* (2013.01); *B23P 15/26* (2013.01); *B23P 2700/10* (2013.01); *F24S 10/506* (2018.05); *F28F 3/044* (2013.01); *F28F 3/14* (2013.01)

(58) Field of Classification Search
CPC .... H01L 21/4875; H01L 21/4882; F28F 3/02; F28F 3/14; F28F 3/044; B21D 53/022; B21D 53/04; F24S 10/506; B23P 2700/10; B23P 15/26

See application file for complete search history.

(56) References Cited

U.S. PATENT DOCUMENTS

| | | | |
|---|---|---|---|
| 6,082,443 A | | 7/2000 | Yamamoto et al. |
| 6,269,866 B1 | | 8/2001 | Yamamoto et al. |
| 6,289,982 B1 | * | 9/2001 | Naji ...................... F28D 1/0341 165/153 |
| 6,397,935 B1 | | 6/2002 | Yamamoto et al. |
| 6,453,989 B1 | * | 9/2002 | Watanabe ............. F28D 1/0341 165/177 |
| 6,535,386 B2 | * | 3/2003 | Sathe .................. H01L 23/4006 165/104.33 |
| 6,578,626 B1 | * | 6/2003 | Calaman ................ F28F 3/022 165/170 |
| 7,017,651 B1 | | 3/2006 | Wilson et al. |
| 7,121,002 B1 | | 10/2006 | Roth |
| 7,264,045 B2 | | 9/2007 | Mehendale et al. |
| 8,736,048 B2 | | 5/2014 | Schultz |
| 2003/0155105 A1 | | 8/2003 | Garner |
| 2003/0159806 A1 | | 8/2003 | Schmbey et al. |
| 2004/0150271 A1 | | 8/2004 | Koga et al. |
| 2005/0115700 A1 | | 6/2005 | Martin et al. |
| 2006/0038284 A1 | | 2/2006 | Brandenburg et al. |
| 2007/0214829 A1 | | 9/2007 | Otake et al. |
| 2007/0227697 A1 | | 10/2007 | Takahashi |
| 2007/0240860 A1 | | 10/2007 | Meyer, IV et al. |
| 2008/0047141 A1 | | 2/2008 | Yang |
| 2010/0090336 A1 | | 4/2010 | Yoskida et al. |
| 2011/0108247 A1 | | 5/2011 | Kawaura et al. |
| 2011/0315367 A1 | | 12/2011 | Romero et al. |
| 2012/0014066 A1 | | 1/2012 | Morino et al. |
| 2012/0082880 A1 | | 4/2012 | Koetting et al. |
| 2013/0140011 A1 | | 6/2013 | Watanabe et al. |
| 2015/0369545 A1 | | 12/2015 | Naritomi et al. |

OTHER PUBLICATIONS

Schultz, "QCM direct Attach", IBM Corporation, Thomas J. Watson Research Center, Sep. 2010.
List of IBM Patents or Patent Applications Treated as Related.

\* cited by examiner

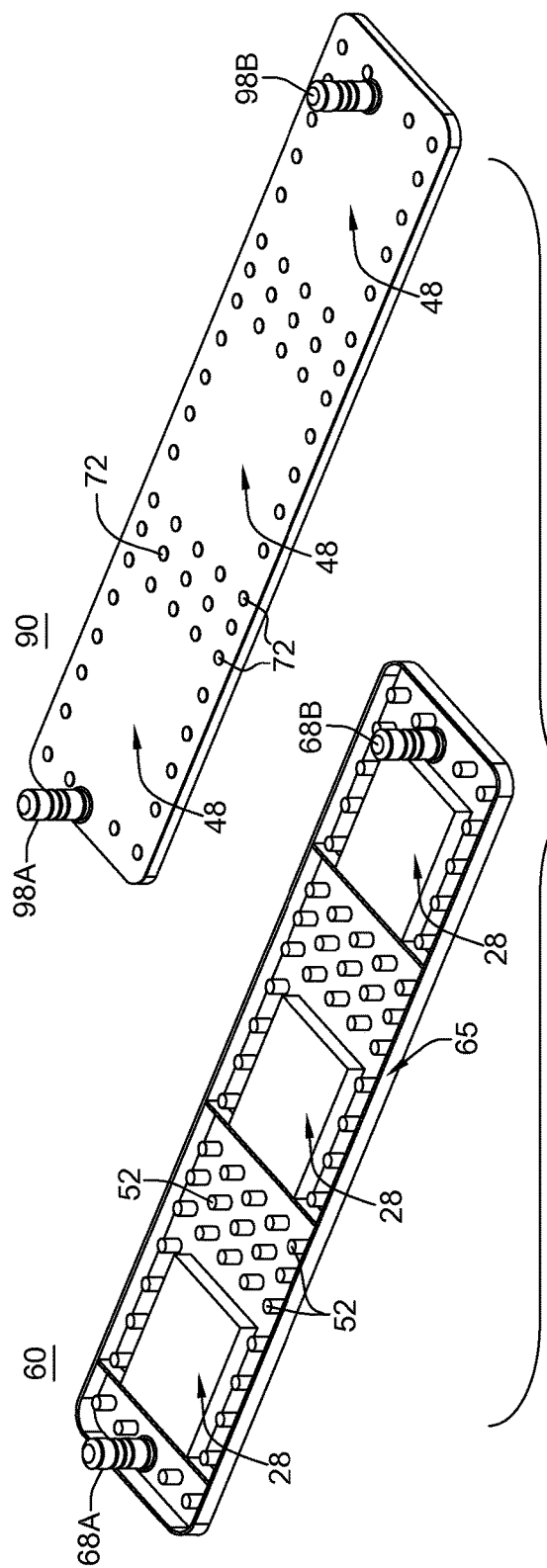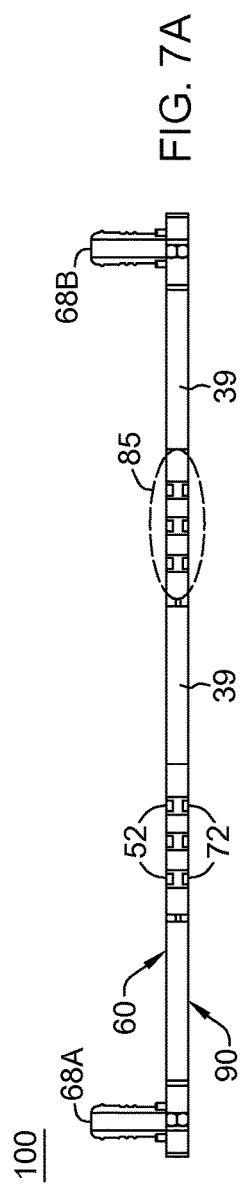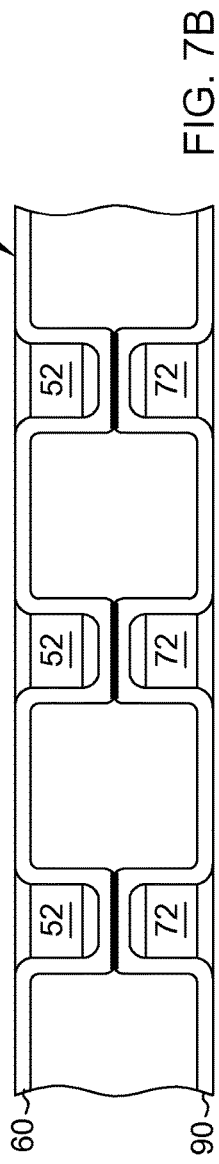

BURST RESISTANT THIN WALL HEAT SINK

CROSS-REFERENCE TO RELATED APPLICATIONS

The present disclosure is a divisional of U.S. patent application Ser. No. 14/818,064 filed Aug. 4, 2015 the entire content and disclosure of which is incorporated herein by reference. U.S. patent application Ser. No. 14/818,064 is a conversion application of U.S. Patent Application Ser. No. 62/143,587, filed Apr. 6, 2015, the contents of which are wholly incorporated herein.

STATEMENT REGARDING FEDERALLY SPONSORED RESEARCH/DEVELOPMENT

This invention was made with Government support under Contract Numbers: B601996 and B604142 awarded by Department of Energy. The Government has certain rights in this invention.

FIELD

The present disclosure generally relates to apparatus for cooling electronic components and modules housed in electronic devices, such as computers, and more particularly to a burst resistant thin-walled cold plate or burst resistant thin-walled heat sink for cooling an electronic component(s).

BACKGROUND

With the increase in heat dissipation from microelectronic devices and the reduction in overall form factors, thermal management becomes a more and more important element of electronic product design. Both the performance reliability and life expectancy of electronic equipment are inversely related to the component temperature of the equipment.

Heat sinks function by efficiently dissipating thermal energy (i.e., "heat") generated from an object (e.g., electronic module or microelectronic component) into a cooler ambient, e.g., the air; and at least transfer thermal energy an object at a high temperature to a second object at a lower temperature with a much greater heat capacity.

In a common design of a heat sink, a metal plate having a flat surface (e.g., a copper or aluminum base) is provided with an array of cooling structures, e.g., combs or fin-like protrusions to increase the heat sink's surface area contacting the air and thus increase the heat dissipation rate. A high thermal conductivity of the metal base combined with its large surface area provided by the protrusions result in the rapid transfer of thermal energy to the surrounding, cooler air.

Liquid cold plates, on the other hand, provide an alternative advantage over some air cooled solutions in high watt density applications and may include tubed cold plates, flat tube cold plates, performance-fin cold plates and liquid-cooled chassis designs.

FIG. 1 shows a cross-sectional view of a current design of a portion of a thin-plate-based cold plate or heat sink 10. In a current embodiment, the heat sink includes parallel formed planar members including a top thin-walled plate member 12, a bottom thin-walled plate member 15 and sidewall structures (not shown) that form a space or chamber 19 for air or fluid flow therein. Inserted within the chamber 19 affixed between parallel top thin-wall and bottom thin-wall plates are a plurality of traverse oriented fins 25 that are oriented to provide one or more communicating air or liquid medium flow paths therein.

In order to withstand a "burst pressure" defined as the point at which the cold plate or heat sink will fail as a result of pressure (e.g., a point determined by providing a liquid flow with force into the communicating flow path inside the hear sink and observing what portions would be broken by the high pressures), the top thin-walled plate 12 and bottom thin-walled plate 15 are currently held together using separate plural support posts 20, two of which are shown in FIG. 1.

In such embodiments, each opposing end 30 of a respective post 20 is soldered or brazed onto the respective top and bottom thin plates as shown in FIG. 1. There is a great cost in implementing these posts, and their manufacture and widespread use in cold plate and heat sink devices are becoming prohibitive.

BRIEF SUMMARY

There is provided a practical design for a heat sink or cooling plate cooling device that implements stamped indent formations for affixing a top planar member to a bottom planar member of the cooling device.

In one aspect, the stamped indent formations are provided on a planar top member surface, each stamped indent formation providing a contact surface that is soldered or brazed to the planar bottom member.

In one aspect, the stamped indent formations are provided on both a planar top member surface, and on a planar bottom member surface, the planar top member having a plurality of stamped indent formations at a plurality of locations, each indent formation providing a contact surface when the planar top member is in a first orientation, and the planar bottom member having a plurality of stamped indent formations at a plurality of locations in alignment with indent formations of the top member, each indent formation providing a opposing contact surface when the parallel planar bottom member is in a second orientation. Each contact surface of indent formations of the planar top member is affixed to an opposing contact surface of a corresponding indent formation of the parallel planar bottom member by solder or braze.

Thus, in one aspect, there is provided a cooling apparatus for an electronic device. The cooling apparatus comprises: a planar top member of a thermal energy conductive material; a planar bottom member of the thermal energy conductive material, the planar bottom member including a surface having one or more regions configured for heat exchange contact with the electronic device; a sidewall structure extending between the top and bottom members and configured to enclose an area including the one or more regions, the planar top member, parallel bottom member and sidewall defining a chamber, and the planar top member having a plurality of stamped indent formations at a plurality of locations, at least one the indent formation providing a contact surface, the planar top member and bottom member affixed using at least one the contact surface.

In a further aspect, there is provided a cooling apparatus for an electronic device or multi-chip module. The cooling apparatus comprises: a planar top member of a thermal energy conductive material; a planar bottom member of the thermal energy conductive material, the planar bottom member including a surface having one or more regions configured for heat exchange contact with the electronic device; a sidewall extending between the top and bottom members and configured to enclose an area including the one or more regions, the planar top member, parallel bottom member and sidewall defining a chamber, and the planar top member having a plurality of stamped indent formations at a plurality of locations, at least one the indent formation providing a contact surface when the planar top member is in a first orientation, the planar bottom member having a plurality of stamped indent formations at a plurality of locations in alignment with indent formations of the top member, at least one the indent formation providing a opposing contact surface when the parallel planar bottom member is in a second orientation, wherein the contact surface of indent formation of the planar top member is affixed to an opposing the contact surface of a corresponding indent formation of the parallel planar bottom member.

BRIEF DESCRIPTION OF THE SEVERAL VIEWS OF THE DRAWINGS

FIG. 7 shows a perspective view of an exposed planar top plate member 60 and a perspective view of an exposed planar bottom plate member 90 showing the plural formed stamped indent formations in areas of a planar surface surrounding cooling structures;

FIG. 7A shows a side cross-sectional view of a formed cooling apparatus 100 having a planar first plate member with formed stamped indent formations joined to corresponding aligned stamped indent formations of the second planar plate by braze or solder; and FIG. 7B depicts a zoomed-in portion 85 of the cross-sectional view of the formed cooling apparatus 100 of FIG. 7A.

DETAILED DESCRIPTION

This disclosure relates to a cooling apparatus, e.g., a heat sink or cold plate, having parallel thin plates, and a cost-effective method to improve the capacity of parallel thin plates to withstand high burst pressure for the cold plate or heat sink applications. Instead of soldering separate posts to hold the top and bottom plates together, the method includes stamping several (plural) indentations into the top thin plate surface, or both the top and bottom thin plate surfaces, in order to make a similar post structure. Resulting indented formations have a contact surface that are each joined or affixed to the opposing plate member by soldering or brazing.

As mentioned herein, reference to a thin-walled plate refers to a plate or sheet of metal heat sink material, e.g., copper, aluminum, etc., of a thickness ranging from 0.5 mm to 1.5 mm thick or any thickness that is suitable for effective cooling when secured in a heat exchange relation with an underlying microelectronic component, e.g., an integrated circuit chip, or electronic assembly, e.g., a multi-chip module (MCM).

Figure 1:
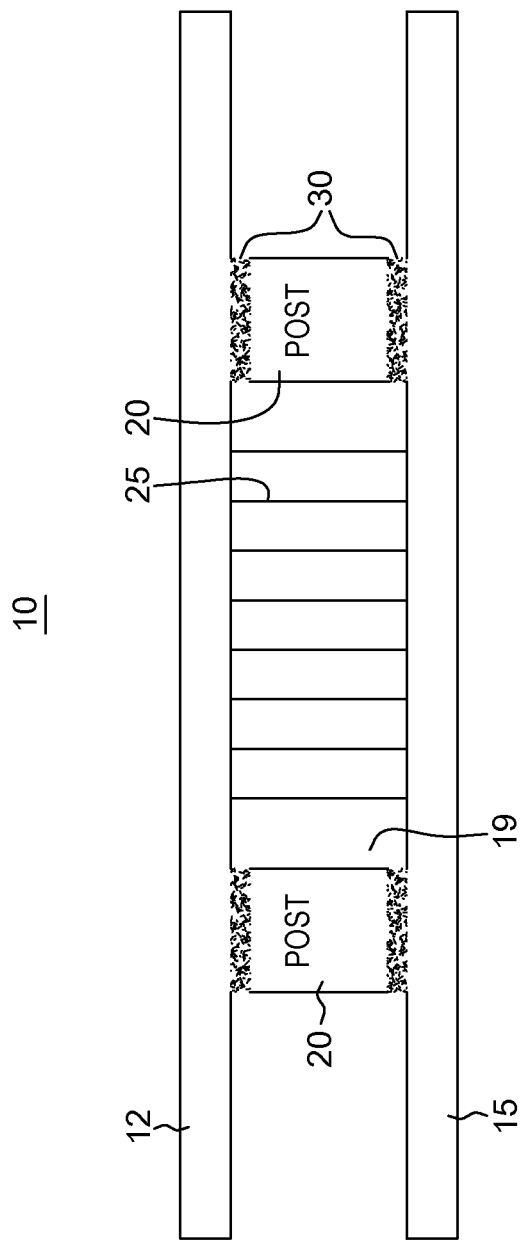
FIG. 1 is a cross-sectional view of a portion of a heat sink cooling device according to a conventional design.
Figure 2:
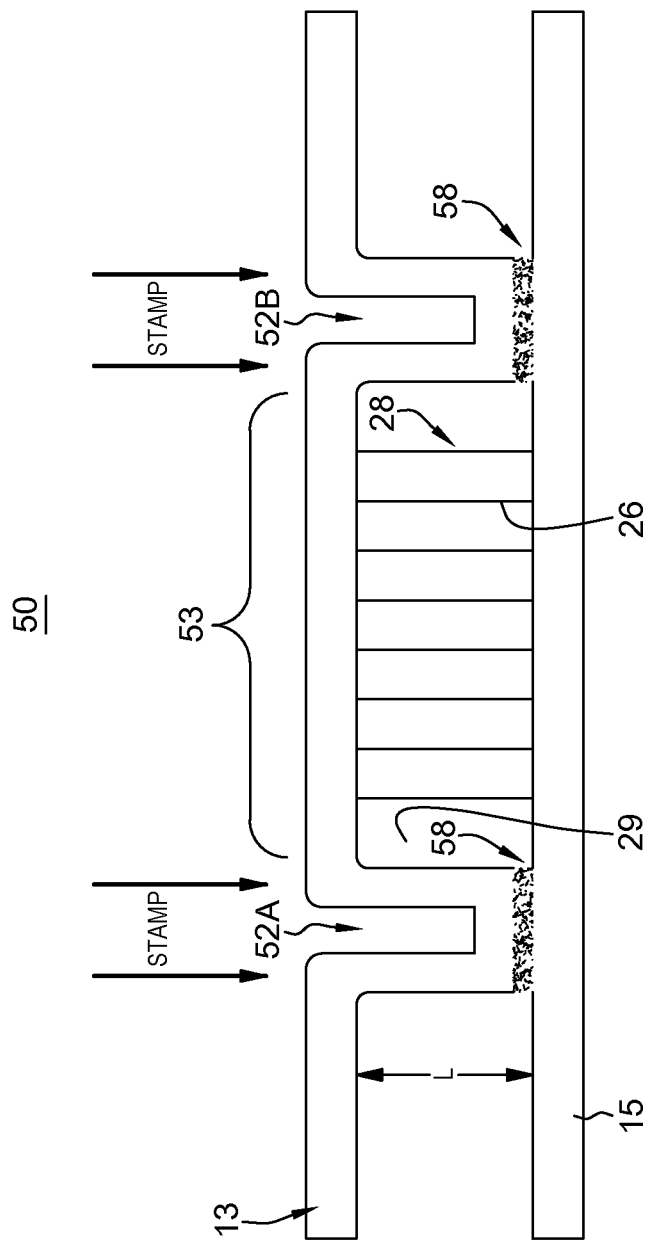
FIG. 2 is a cross-sectional view of a portion of heat sink or cold plate cooling apparatus according to a first embodiment of the present disclosure.

FIG. 2 shows a cross-sectional view of a portion 50 of a heat sink or cold plate ("cooling apparatus") according to one embodiment of the present disclosure. In the embodiment of the portion 50 depicted in FIG. 2, the cooling apparatus includes parallel formed plate members including a planar top thin-walled plate member 13, and a parallel planar bottom thin-walled plate member 15. A sidewall portion (not shown) formed to extend between the planar top and bottom member about a periphery thereof is provided to define a space or chamber 29 for a media flow therein. The media may be air, or may be a liquid such as water. In this embodiment of a cooling device, there are no separate pieces added in order to hold the top thin plate 13 and bottom thin plate 15 together in parallel. Rather, in the embodiment of the cooling device 10 shown in FIG. 2, the top thin plate 13 has plural stamped indentations formed such as the two stamped indentations 52A and 52B shown in FIG. 2. In the orientation of planar top member 13 shown in FIG. 2, each stamped indentation 52A, 52B is a formation extending in a direction within said formed chamber that includes a respective underside flat contact surface portion that is soldered or brazed as shown at 58 onto a top surface of the bottom parallel thin-wall base plate 15, in order to prevent the chamber 29 from bulging under application of pressure. In the embodiment depicted in FIG. 2, the stamped indentations 52A, 52B are formed in the top thin-walled plate 14 however, the bottom member in opposite orientation, may include the formed stamped indentations.

For its manufacture, a top thin-walled sheet of thermal energy conductive material, e.g., a metal, is located within a metal works stamp press (not shown), i.e., a pressing machine or punching machine. A metal stamping process in employed that uses a die to transform a flat thin metal plate (or sheet) into the plates as shown in FIG. 2 having spaced apart indents. Any mechanical and hydraulic stamping press may be implemented in which a metal stamping machine may cast, punch (in the direction shown by arrows labeled "stamp"), cut and shape the top metal plate/sheet. The stamping of the top thin plate of the cooling device to create the three-dimensional shape shown in FIG. 2 includes inserting a flat sheet of metal into the die and then activating the mechanical press to create the indents in the planar thin-walled sheet. The metal stamping machine (not shown) may be programmed to provide a stamp having the desired shape and size for producing one or more indents.

In one embodiment, the stamp dies for a metal stamping press (not shown) may vary, and the resulting stamped indents 52A and 52B formed can be of a depth of any shape. In one non-limiting embodiment, the length of a stamp (and corresponding formed indent depth dimension) may range anywhere between 2 mm to 10 mm, however, other ranges are configurable. These may produce indents ranging between approximately 0.5 mm to 10 mm in depth.

In one embodiment, the stamp dies used in the pressing machine or punching machine are of polygonal cross-section (not shown), e.g., square or rectangular cross-sectional shape, such that the formed indent formations 52A, 52B are of a polygonal square or rectangular shape and of a length "L" substantially equal to a height of said chamber 29. In one embodiment, the stamp dies used in the pressing machine or punching machine are circular cross-sectional shape such that the formed indent formations 52A, 52B are of a cylindrical shaped of a length "L" substantially equal to a height of said chamber 29. In one embodiment, the height of the chamber ranges from between 0.5 mm to 10 mm, or from between 1 mm to 8 mm in depth. It is understood that indent depths are configurable beyond the ranges as specified. A diameter or width of the formed indent formation shape ranges anywhere from between 1 mm to 10 mm.

As further shown in FIG. 2, the cooling apparatus portion 50 further includes a cooling structure 28 comprising an array of cooling fins, pins, or like structures 26 that extend from the bottom thin base plate 15 to a planar surface portion 53 of the top thin-walled plate 13 defining a top wall for the chamber 29. The underlying contact surface formed at each indented formation 52A, 52B of the top-thin walled plate that is brazed or soldered onto the bottom thin base plate 15 to hold the plates 13, 15 together, obviates the need for separate posts while maintaining strength to withstand application of a pressure according to the needs of the cooling application. For example, depending upon the application, the devices may be able to withstand burst pressures of 150 psi. and beyond.

Figure 6:
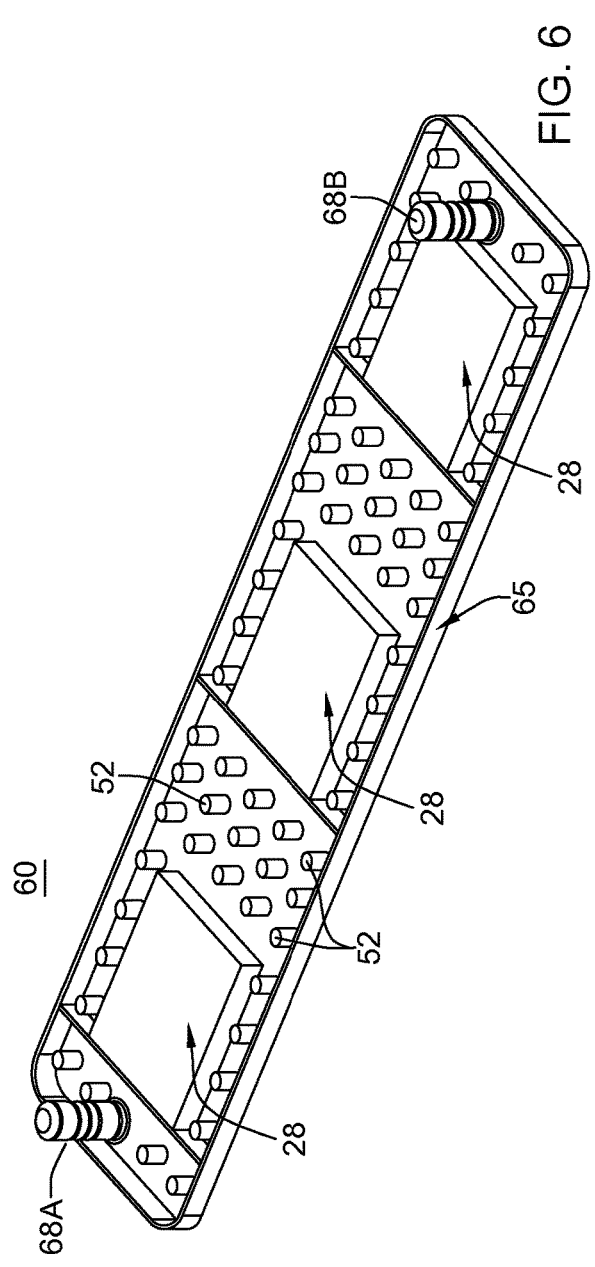
FIG. 6 shows a perspective view of an exposed planar top plate 60 (or planar bottom plate member) showing the plural formed stamped indent formations in areas of a planar surface surrounding cooling structures.

FIG. 6 shows a perspective view of an exposed planar plate member 60 oriented as a planar bottom plate member according to one embodiment showing the plural formed stamped indent formations 52 in areas of a planar surface not including the cooling structures 28. A sidewall 65 is shown formed about the peripheral edge of the planar bottom plate member 60 and is of a height substantially commensurate with the height of a top surface of the cooling structures 28. Inlet and outlet orifice connection 68A, 68B are provided and formed to extend external to a surface of the cooling member for connection to a media source, e.g., liquid water.

Figure 6A:
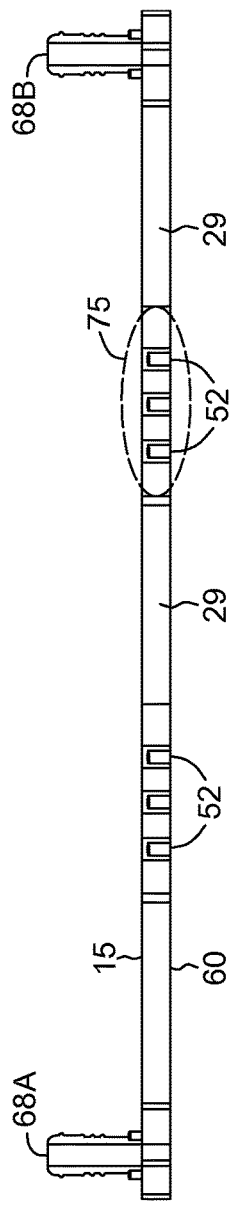
FIG. 6A shows a side cross-sectional view of a formed cooling apparatus 70 having a planar first plate member with formed stamped indent formations joined to second planar plate member at the braze or solder locations.
Figure 6B:
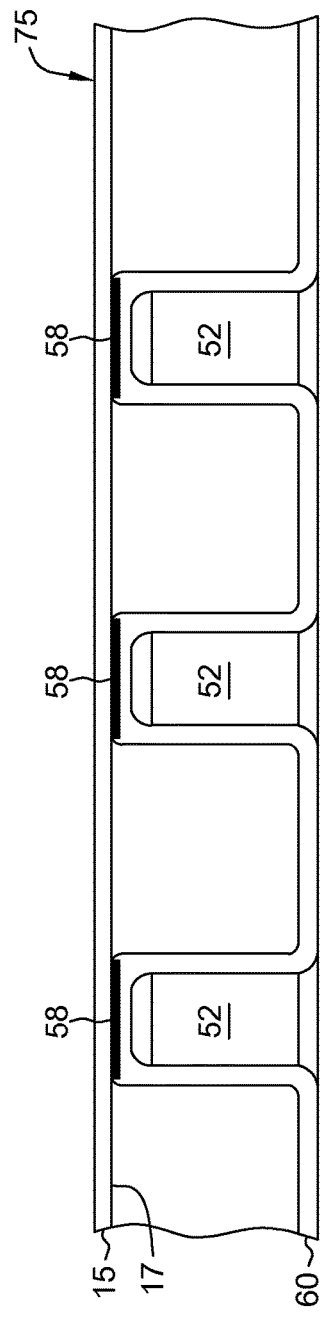
FIG. 6B depicts a zoomed-in portion 75 of the cross-sectional view of the formed cooling apparatus 70 of FIG. 6A.

FIG. 6A shows a side cross-sectional view of a formed cooling apparatus 70 having a planar first plate member 60 with formed stamped indent formations 52 joined to a second planar plate member 15 at the braze or solder locations and defining chamber regions 29 for placement of the cooling structures (not shown). FIG. 6B depicts a zoomed-in portion 75 of the cross-sectional view of the formed cooling apparatus 70 of FIG. 6A. In the portion 75 depicted, each stamped indent formations 52 of planar first plate member 60 is shown with each contact surface 58 of an indent soldered or brazed to the inside surface 17 of the planar second plate member 15.

Figure 3:
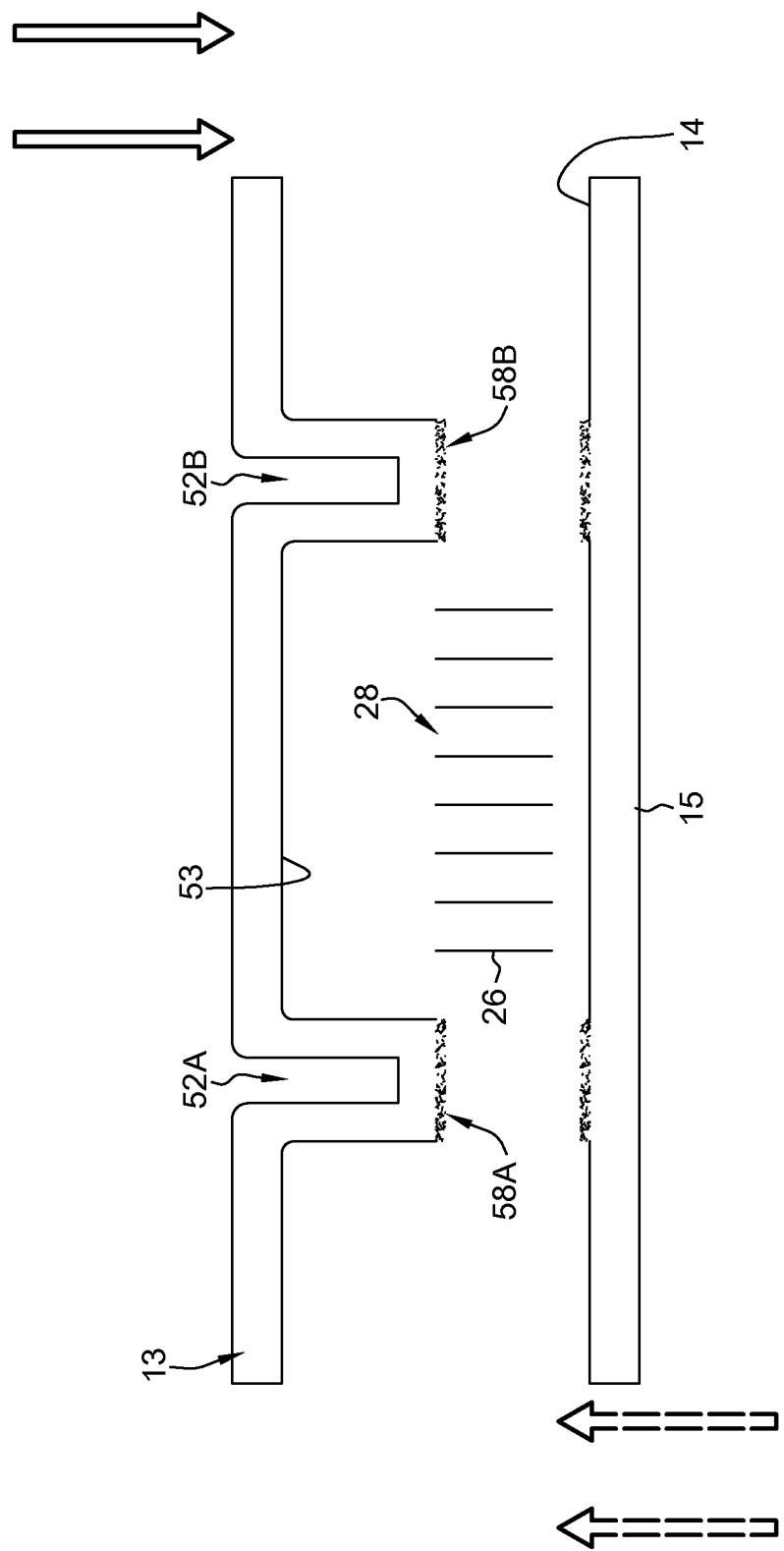
FIG. 3 shows conceptually a method step for joining the planar top thin-walled plate member and the parallel planar bottom thin-walled plate member of cooling apparatus according to the first embodiment.

FIG. 3 shows conceptually a method step for joining the planar top thin-walled plate member 13 and the planar bottom thin-walled plate member 15. In this embodiment, the top thin-walled plate 13 has been prior stamped to include indented portions 52A, 52B which, in the embodiment shown, each provide a respective flattened underside bottom surface portion 58A, 58B used to join a bottom plate. Further, in this embodiment, an array of cooling structures, e.g., fins 26 are shown prior to positioning on a surface of the planar bottom member 15 of the plate 13. In a non-limiting embodiment, the length of each of the fins 26 is commensurate with the depth of the formed indents 52A, 52B. In a non-limiting embodiment, both an inner surface 14 of the planar bottom plate member 15 and an opposing inner surface of the planar top plate member 13 may have a solder or braze paste material coated thereon to facilitate a subsequent soldering or brazing step. In one embodiment, the planar bottom member 15 having cooling structure 28 located thereon at pre-determined regions may be fixed in orientation, and the top thin plate 13 having the stamped indentations 52A and 52B registered in the direction indicated by solid arrows relative to the fixed bottom parallel thin-wall base plate 15 to join onto the bottom base plate 15 and this structure is subsequently placed in an oven and subject to soldering or brazing temperatures sufficient to affix the top and bottom plate members together. In this embodiment, each respective flat underside bottom surface portion 58A, 58B of respective indents 52A, 52B of top parallel plate 13 is soldered or brazed to a top surface 14 of the bottom thin-wall base plate 15. In an alternate embodiment, the top parallel plate 13 may be fixed in orientation and the bottom plate 15 having cooling structure 28 located thereon at pre-determined regions may be registered relative to the top plate 13 in the direction indicated by broken arrows to join onto the top plate member 13 and this structure is subsequently placed in an oven and subject to soldering or brazing temperatures sufficient to affix the top and bottom plate members together.

Figure 4:
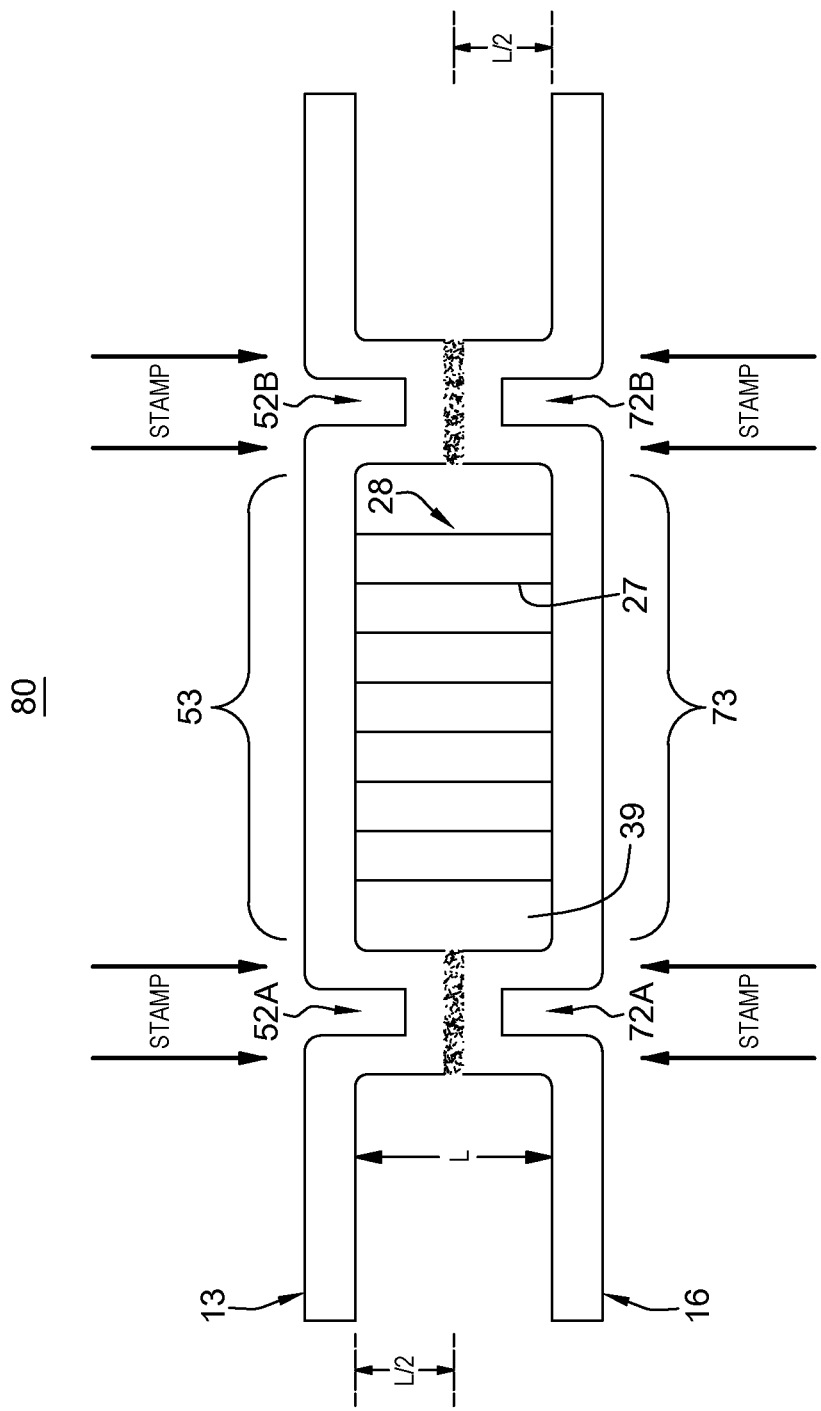
FIG. 4 shows a cross-sectional view of a portion of a heat sink or cold plate apparatus according to a further embodiment of the present disclosure.

FIG. 4 shows a cross-sectional view of a portion of a heat sink or cold plate cooling apparatus device 80 according to a further embodiment of the present disclosure. As in the first embodiment, the cooling apparatus includes parallel formed plate members including a planar top thin-walled plate member 13, and a parallel planar bottom thin-walled plate member 16. A sidewall portion (not shown) formed to extend between the planar top and bottom member about a periphery thereof is provided to define a space or chamber 39 for a media flow therein. The media may be air, or may be a liquid such as water. In this embodiment of a cooling device, there are no separate pieces added in order to hold the top thin plate 13 and bottom thin plate 16 together in parallel. Rather, in the embodiment of the cooling device 80 shown in FIG. 4, both the top thin-walled plate 13 and a bottom thin-walled plate 16 are each provided with a respective plurality of stamped indented formations in alignment, wherein the indented formations are oriented in opposed directions and are soldered or brazed together. That is, in the embodiment depicted in FIG. 4, not only does the top thin-walled parallel plate 13 include respective indent formations 52A, 52B, each having underside surface contact surface as in the embodiment of FIG. 2, but the bottom thin-walled parallel plate 16 also include the same plurality of indents 72A, 72B, each respective indent formed to include a respective flattened, contact surface. When in an opposed orientation relative to the orientation of the top plate 13, the respective flattened, contact surfaces of indents 72A, 72B are joined by braze or solder to respective aligned surface contact portions of respective indents 52A, 52B in order to affix the top thin-walled plate 13 and the bottom thin-walled plate 14 together with force sufficient to prevent the cooling chamber 39 therein from bulging under application of pressure. For example, each top thin-walled plate 14 and bottom thin-wall plate 16 is first stamped with a stamp press in order to form the respective indents (as shown by the sets of arrows labeled "stamp" representing the stamp direction used in providing the respective indent). It is understood that a single process may be used to form the indented top plate 14 and indented bottom plate 16 (as the top and bottom plates are interchangeable when oppositely oriented). The cooling device portion 80 of this further embodiment further includes an array 28 of cooling fins 27 that are affixed in the chamber and extend between the bottom thin base plate 16 to the top thin plate portion surface within the chamber 39 for influencing air or liquid flow. The indented portions 52A, 52B of the top thin-walled plate 13 being brazed or soldered to the respective indented portions of the bottom thin-walled base plate 16 obviates the need for separate posts while maintaining strength to withstand burst pressure.

As in the first embodiment, the stamp dies used in the pressing machine or punching machine are of a polygonal, e.g., square or rectangular cross-sectional shape, or are circular or cylindrical. In this embodiment, as depicted in FIG. 4, the formed stamped indent formations 52A, 52B in the planar top plate member 13 and the formed stamped indent formations 72A, 72B in the planar bottom plate member 16 are of a length "L/2" such that when underside contact surface of each corresponding stamped indent formations 52A, 52B are soldered or brazed to stamped indent formations 72A, 72B, the total height of said chamber 39 is the same length L as in the first embodiment.

As further shown in FIG. 4, the cooling apparatus portion 80 further includes the cooling structure 28 comprising an array of cooling fins, pins, or like structures 27 that extend from a planar surface portion 73 of the planar bottom thin plate 16 to a planar surface portion 53 of the top thin-walled plate 13 defining a top of the chamber 39. The underlying contact surface formed at each indented formation 52A, 52B of the top-thin walled plate that is brazed or soldered onto the bottom thin base plate 15 to hold the plates 13, 15 together obviates the need for separate posts while maintaining strength to withstand application of a pressure.

FIG. 7 shows a perspective view of an exposed planar plate member 60, as described with respect to the embodiment of FIG. 6, which may be a planar top plate member, and a corresponding exposed perspective view of an underside of planar bottom plate member 90. In this embodiment, the corresponding planar bottom plate member 90 is shown having the plural formed stamped indent formations 72 therein in areas of the planar surface that directly correspond to the plural formed stamped indent formations 52 formed in the parallel planar top member 60. The planar bottom plate member 90 is shown having regions 48 corresponding to locations that are secured to the electronic device, e.g., chip or MCM, and where cooling structures 28 are to be affixed inside the chamber. Further shown in FIG. 7 are respective inlet and outlet orifice connections 98A, 98B are provided and formed to extend external to a surface of the cooling member for connection to a media source, e.g., liquid water.

FIG. 7A shows a side cross-sectional view of a formed cooling apparatus 100 having a planar first plate member 60 with formed stamped indent formations 52 joined to contact surfaces of formed stamped indent formations 72 of second planar plate member 90 at the braze or solder locations and defining chamber regions 39 for placement of the cooling structures (not shown). FIG. 7B depicts a zoomed-in portion 85 of the cross-sectional view of the formed cooling apparatus 70 of FIG. 6A. In the portion 85 depicted, each stamped indent formation 52 of planar first plate member 60 is shown with each contact surface of an indent soldered or brazed (affixed) to an opposing contact surface of a corresponding stamped indent formation 72 of planar second plate member 90.

Figure 5:
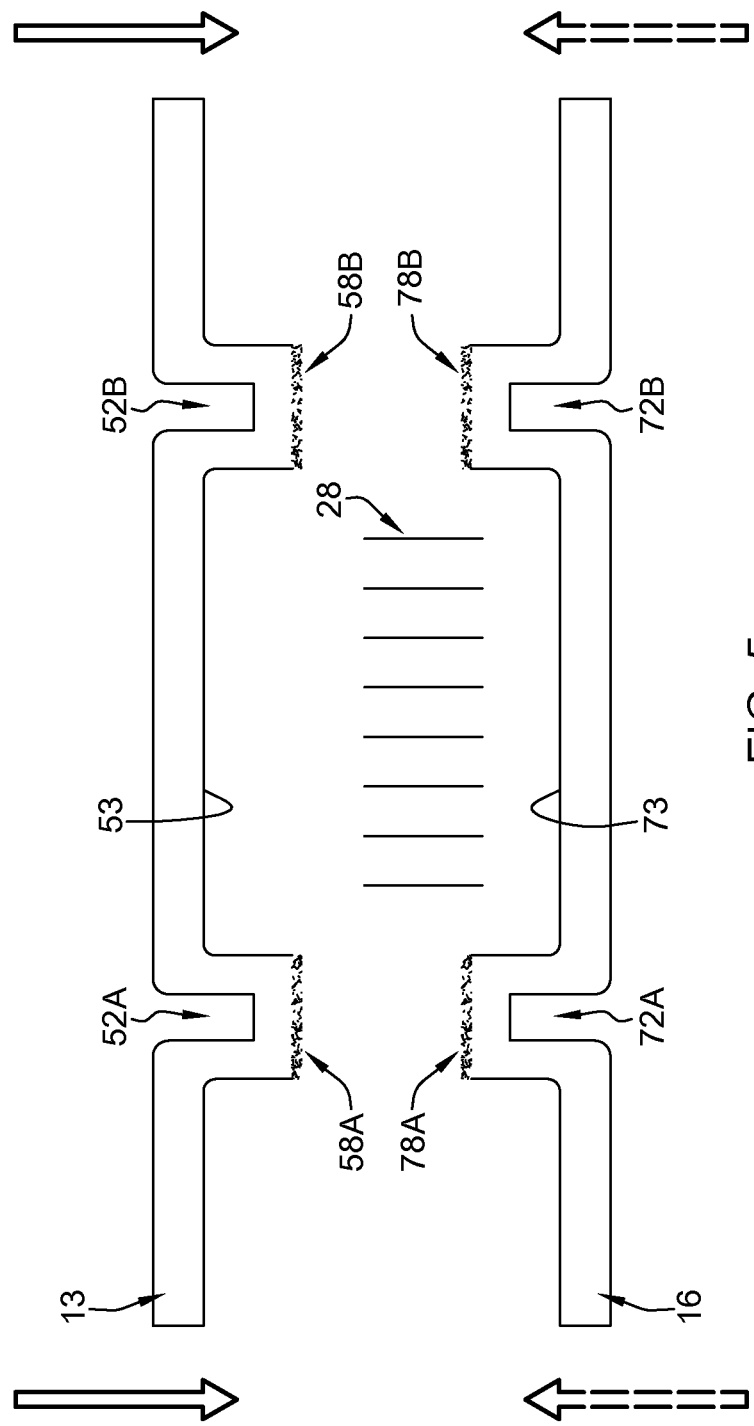
FIG. 5 shows conceptually a method step for joining the planar top thin-walled plate member and the parallel planar bottom thin-walled plate member of cooling apparatus according to the further embodiment.

FIG. 5 shows a method step for joining the planar top thin-walled plate member 13 and the planar bottom thin-walled plate member 16 of the embodiment of FIG. 4. In this embodiment, the planar top thin-walled plate 13 has been prior stamped to include indented portions 52A, 52B which, in the embodiment shown, each provide a respective flattened underside bottom surface contact portion 58A, 58B, and the planar bottom thin-walled plate 16 has been prior stamped to include indented portions 72A, 72B which, in the embodiment shown, each provide a respective flattened underside bottom surface portion 78A, 78B. With the planar bottom thin-walled plate member 16 in opposed orientation relative to the top thin-walled plate member 13, and with all interior surfaces 53, 73 coated with a braze or solder paste material to facilitate a subsequent soldering or brazing step, in one embodiment, the planar bottom member 16 having cooling structure 28 located thereon at pre-determined regions may be fixed in orientation, and the contact surfaces 58A, 58B of the stamped indentations 52A and 52B of top thin plate 13 registered in the direction indicated by solid arrows relative to the fixed bottom parallel thin-wall base plate 15 to join the respective contact surfaces 78A, 78B of the stamped indentations 72A and 72B of top thin plate 16, and once joined, this structure is subsequently placed in an oven and subject to soldering or brazing temperatures sufficient to affix the top and bottom plate members together. In an alternate embodiment, the top parallel plate 13 may be fixed in orientation and the bottom plate 16 having cooling structure 28 located thereon at pre-determined regions may be registered relative to the top plate 13 in the direction indicated by broken arrows to join onto the top plate member 13 and this structure is subsequently placed in an oven and subject to soldering or brazing temperatures sufficient to affix the top and bottom plate members together at contact surface interfaces.

Thus, whether formed for application as a cold plate or heat sink, the structure and methods described herewith improve the capacity of parallel thin plates to withstand a high burst pressure.

The teachings herein may be implemented to enhance reliability of heat sink devices such as the heat sink device described in commonly-owned U.S. Pat. No. 8,736,048. The whole contents and disclosure of U.S. Pat. No. 8,736,048 are incorporated herein by reference as if fully set forth herein. This U.S. Pat. No. 8,736,048 in particular, is directed to heat sink devices having lateral compliance feature.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method for forming a cooling apparatus having a planar top member, a parallel planar bottom member and a sidewall structure defining an enclosed chamber configured for a fluid flow therein, the method comprising:
stamping the planar top member to provide a plurality of stamped indent formations;
stamping the planar bottom member to provide a plurality of stamped indent formations, said planar bottom member including a surface having one or more regions configured for heat exchange contact with an electronic device;

providing one or more arrays of fins or blades on a planar bottom member surface within said chamber at one or more areas in alignment with said one or more regions configured for said heat exchange contact, said fins or blades of each array extending between the planar bottom member to the planar top member within the chamber and oriented for directing a flow of a liquid media within said chamber;

locating the planar top member atop the parallel planar bottom member, the planar top member having the plurality of stamped indent formations at a plurality of locations, each indent formation providing a contact surface when said planar top member is in a first orientation, and the planar bottom member having the plurality of stamped indent formations at a plurality of locations in alignment with the plurality of stamped indent formations of said top member, each indent formation providing an opposing contact surface when said parallel planar bottom member is in a second orientation;

one of: brazing or soldering each said contact surface of the plurality of stamped indent formations of said planar top member to an opposing contact surface of a corresponding indent formation of said parallel planar bottom member using a respective braze or solder material, and brazing or soldering opposing edges of said array of fins or blades to affix said array of fins or blades to each of said planar top and planar bottom members with said chamber; and providing an inlet orifice positioned at a first end of the planar bottom member and an outlet orifice positioned at an opposite end of the planar bottom member for extension beyond an external surface of the planar top member and for connection to a liquid media source, wherein the providing of one or more arrays of fins or blades comprises: disposing each of the areas of the one or more arrays of fins or blades in spaced apart relation between the inlet and outlet orifices, and the plurality of stamped indent formations being disposed between areas of the one or more arrays of fins or blades.

2. The method as claimed in claim 1, wherein the planar top and planar bottom members comprise a thermal energy conductive material, the method further comprising:

extending the sidewall structure between said top and bottom members to enclose an area including said one or more regions, said planar top member, parallel bottom member and sidewall structure defining a chamber.

3. The method as claimed in claim 2, wherein the cooling media is liquid or air.

4. The method as claimed in claim 1, wherein each stamped indent formation on said planar top and planar bottom members is of a polygonal square or rectangular shape of a length substantially equal to one-half a height of said chamber.

5. The method as claimed in claim 1, wherein each said stamped indent formation on said planar top and planar bottom members is of a circular or cylindrical shape of a length substantially equal to one-half a height of said chamber.

6. The method as claimed in claim 1, further comprising:

forming said sidewall structure about a periphery of one of said planar top member or parallel planar bottom member, wherein said sidewall structure is flexible and laterally compliant.

7. The method as claimed in claim 1, wherein the providing said one or more arrays of fins or blades on a planar bottom member surface within said chamber further comprises: positioning a first array of fins or blades in a first area adjacent to the positioned inlet orifice and positioning a second array of fins or blades in another area adjacent to the positioned outlet orifice.

* * * * *